United States Patent [19]

Rufford

[11] 4,393,473

[45] Jul. 12, 1983

[54] RANDOM ACCESS MEMORY PRESET CIRCUITRY

[75] Inventor: Roger V. Rufford, Redwood City, Calif.

[73] Assignee: Fairchild Camera & Instrument Corp., Mountain View, Calif.

[21] Appl. No.: 282,893

[22] Filed: Jul. 13, 1981

[51] Int. Cl.³ .................... G11C 7/00; G11C 11/40
[52] U.S. Cl. .................................. 365/190; 365/155
[58] Field of Search ...................... 365/154, 155, 190

[56] References Cited

U.S. PATENT DOCUMENTS

| | | |
|---|---|---|
| 3,503,051 | 3/1970 | Chambet-Falquet et al. ...... 365/190 |
| 4,035,784 | 7/1977 | Brown ................................ 365/155 |
| 4,297,598 | 10/1981 | Smith ................................ 365/155 |

*Primary Examiner*—Stuart N. Hecker
*Attorney, Agent, or Firm*—Kenneth Olsen; Carl L. Silverman; Theodore S. Park

[57] ABSTRACT

Circuitry for presetting a bipolar random access memory includes switching transistors, responsive to an applied memory preset signal, for opening the circuit between the memory word lines and their respective current sources, for applying a positive voltage to the bottom word lines, for breaking the circuitry between bit line clamping circuits and their respective power sources, and for grounding the bit line pairs to drain all current from the bit line circuits. The preset circuitry also includes read/write control transistors coupled between each bit line and a $V_{cc}$ source for steering the set of the memory cells upon removal of the preset signal.

6 Claims, 1 Drawing Figure

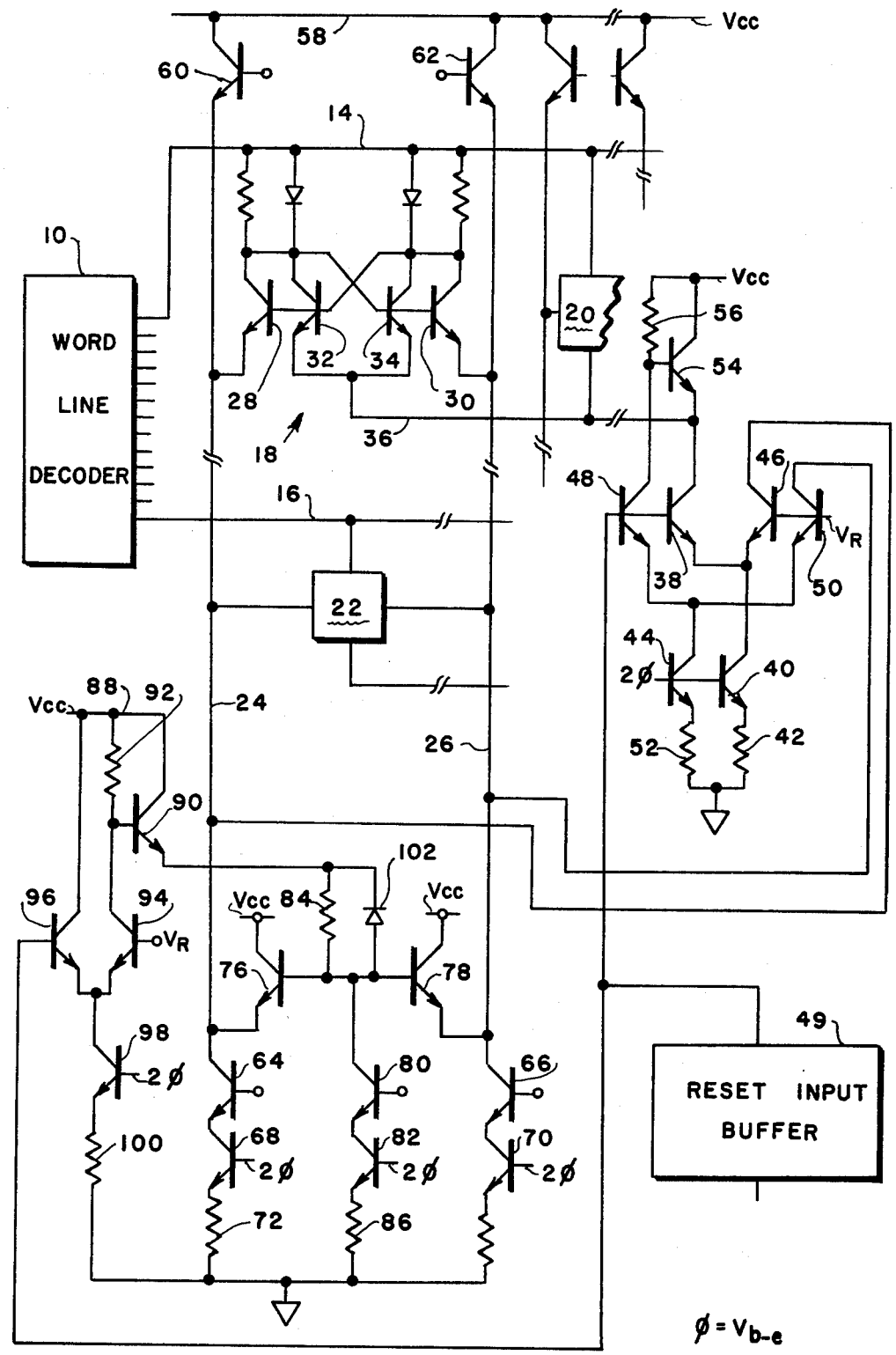

RANDOM ACCESS MEMORY PRESET CIRCUITRY

TECHNICAL FIELD

This invention relates to random access memories for digital computers or the like and particularly to circuitry for presetting all cells of a random access bipolar memory to the same binary state.

BACKGROUND ART

Random access memories, usually called RAMs and often direct access memories, are extensively used in virtually all digital computing equipment for the temporary storage of binary information which may be rapidly retrieved in a random search without first searching through a large volume of irrelevant data. There are several types of RAMs, the most popular being the bipolar memory because it is non-destructive and because of its manufacturing simplicity, low cost, high reliability, and low current demand. A bipolar RAM may be described as a matrix of a large quantity of individual memory cells with vertical columns of cells interconnected by bit lines, and horizontal rows interconnected by top and bottom pairs of word lines. Each cell is, in its simplest form, a bistable flip-flop consisting of two cross-coupled inverter circuits each usually employing a pair of transistors or a dual emitter transistor with one emitter of each inverter connected to the bottom word line that is connected to all cells in that horizontal row, and a second emitter coupled to one of two bit lines coupled to all cells in that vertical column. When one transistor of the flip-flop pair is enabled, it represents a binary "1", while the disabled transistor of the pair would be read as a binary "0". One of the bit lines in each column is connected to output sensing circuitry and also to a write amplifier. A selected cell is normally read by selecting and raising the voltage on the top word line to provide $V_{cc}$ to the cell and by providing a current source to the bottom word line. The voltage on the bit lines is maintained constant and the sense amplifier coupled to the bit line will sense the presence or absence of current in the bit line because of the ON or OFF state of the cell transistor connected to that bit line.

Writing into a particular cell is accomplished by raising the top word line of the selected cell and lowering the voltage on one bit line to enable the transistor connected to that bit line. Thus, to write into a particular selected cell a word line selecting circuit, such as a word line decoder, will raise the voltage on the top word line to thereby enable all the cells in that horizontal row and thereby permit each of the sensing circuits to detect the state of each cell in that selected horizontal row. Writing is accomplished by similarly raising the voltage on the word line in a selected horizontal row, but dropping of voltage on a selected bit line to thereby write into the cell at the junction of the selected bit line and word line. As long as a low standby current is provided to each cell, the RAM is said to be non-destructive so that all binary data entered into the memory will remain intact until rewritten.

It is often desired to reset a RAM so that all cells are reset to the same binary number. There are two presently accepted circuits for accomplishing this reset process. One method involves the construction of an unsymmetrical cell at each cell location. Presetting a matrix of unsymmetrical cells involves raising the word line voltage and dropping the voltages on both bit lines by an equal amount and, because of the lack of symmetry of each of the cells, one transistor of the flip-flop circuit will conduct heavier than the other transistor so that each cell will be set to this heavy conducting side. In general, this unsymmetrical cell method is unreliable because of its sensitivity to manufacturing process variations. A second method currently in use involves the use of an extra or third emitter on one or both sides of the cell flip-flop, thereby enlarging the size of the cell and its associated deposited conductors.

These problems are overcome by the present invention which employs simple small cell that is not process dependent and one which has the advantage of permitting the presetting of the RAM in either state.

DISCLOSURE OF THE INVENTION

Briefly described, the invention includes the addition of two differential circuits to each horizontal word line pair and one to each vertical bit line pair. All differential circuits are responsive to a reset input signal from an input buffer and simultaneously operate to rapidly apply $V_{cc}$ to each bottom word line to halt the flow of low standby current from the rows of cells, drain the current from each bit line pair, and disable the bit line clamping circuits to prevent current sourcing into the bit lines. One of two transistor switches between $V_{cc}$ and the bit lines is then closed and, when the reset input signal is removed to restore the cell standby current and the bit line clamping circuits, and upon the application of $V_{cc}$ to the top word line, all cells will become reset to the desired binary state depending upon the state of the two transistor switches.

BRIEF DESCRIPTION OF THE DRAWINGS

The single FIGURE illustrates a schematic diagram of a portion of a random access memory and the associated preset circuitry.

BEST MODE OF CARRYING OUT THE INVENTION

The schematic diagram of circuitry for carrying out the invention is illustrated in the drawing which includes a conventional word line decoder 10 that provides a low standby current but which, in response to a binary input at terminals 12, selects and energizes one of a plurality of top word lines such as word line 14 or the word line 16. Each of the top word lines, such as word line 14, is connected to a horizontal row of memory cells such as the cells 18 and 20 or the cell 22 in the horizontal row connected to the top word line 16.

Each of the memory cells, such as the cell 18 and cell 22, are aligned in vertical columns and connected to a left bit line 24 and a right bit line 26. Since each of the plurality of cells in the entire memory is coupled in a horizontal row in a vertical column, it is apparent that any one of the cells may be identified or selected by the selection of the appropriate vertical column and horizontal row.

Each of the cells in the matrix is identical and, as illustrated by cell 18, comprises a flip-flop of crisscrossed OR gates including the NPN transistors 28 and 30 the emitters of which are respectively coupled through resistors to the bit lines 24 and 26, respectively. Additional transistors 32 and 34 are respectively coupled in parallel with transistors 28 and 30 but have their emitters coupled together and to a suitable current source which maintains a standby current through each unaddressed cell in order to retain the binary value stored therein. All memory cells in the horizontal row coupled to the top word line 14 are also coupled to a bottom word line 36 and the standby current conducted through the bottom word line flows through a normally conducting transistor 38 and through the current source comprising transistor 40 and resistor 42 to ground reference. The base of the current source transistor 40 is coupled to a fixed D.C. voltage source having an amplitude of approximately 1.5 volts or twice the base-to-emitter voltage of the transistor. This reference voltags is also applied to a second current source transistor 44, the purpose of which will be explained later.

NPN transistor 38 and an identical transistor 46 comprise a differential circuit with the emitters of both transistors coupled together and to the collector of the transistor 40. The base of transistor 46 is coupled to a positive voltage reference having an amplitude substantially below the base voltage on the transistor 38 so that during normal operation of the memory, transistor 46 is cut off whereas transistor 38 is conducting to provide a standby current path for all memory cells associated with the bottom word line 16. The base of transistor 38 is coupled to the base of an identical transistor 48 and to the output of a reset input buffer 49 which, during normal operation of the memory, provides a positive output voltage that will maintain transistors 38 and 48 in a conductive state. The transistor 48, together with a second identical transistor 50, forms a differential circuit with the emitters of transistors 48 and 50 and are coupled together and to the collector of the transistor 44, the emitter of which is coupled through a resistance 52 to ground. The collector of transistor 48 is coupled to the base of an NPN clamping transistor 54, the collector of which is connected to a $V_{cc}$ source and the emitter of which is connected to the collector of transistor 38. The base of clamping transistor 34 is also coupled to the $V_{cc}$ source through a resistor 56.

The collectors of transistors 46 and 50 are connected to the vertical bit lines 24 and 26, respectively. The upper end of bit lines 24 and 26 are connected to the emitters of write/read control transistors 60 and 62, respectively, the collectors of which are coupled to a $V_{cc}$ source conductor 58. The bottom ends of the bit lines 24 and 26 are respectively coupled through transistor switches 64 and 66 and through respective current sources comprising transistors 68 and 70 and resistors 72 and 74, respectively, to ground reference. The bit lines 24 and 26 are also coupled to a bit line clamp circuit comprising transistors 76, 78, 80, 82 and resistances 84 and 86. The collectors of transistors 76 and 78 are connected to a $V_{cc}$ source and their emitters are respectively connected to bit lines 24 and 26. The bases of transistors 76 and 78 are connected together and through a transistor switch 80 to a current source comprising the transistor 82 in series with resistance 86. Current from a $V_{cc}$ source conductor 88 is applied through the emitter of a transistor switch 90 and through its emitter and the resistance 84 to the bases of transistors 76 and 78 and to the bit line clamping circuit. During normal operation of the memory, transistor 90 is conductive to provide normal operating power to the bit line clamping circuit.

The base of transistor 90 is coupled through a resistance 92 to $V_{cc}$ conductor 88 and also to the emitter of a transistor 94. Transistor 94 and an identical NPN transistor 96 are coupled in a differential circuit with the emitters of the two transistors coupled together and to the emitter of transistor 98, the collector of which is coupled through a resistance 100 to ground reference. The base of transistor 98 receives a fixed voltage of approximately 2 $V_{be}$ and the transistor 98 and resistor 100 form a current source for the differential circuit including transistors 94 and 96. The base of transistor 94 is coupled to a positive reference voltage substantially lower than the base voltage applied to transistor 96 so that during normal operation of the memory, transistor 96 is conductive while transistor 94 is cut-off. The base of transistor 96 receives its signal from the reset input buffer 49.

NORMAL OPERATION

During normal operation of the memory circuit, the reset input buffer 49 produces a high output to the bases of transistors 38, 48 and 96. Transistor 48 is conducting to permit the current source comprising transistor 44 and resistor 52 to set the current through transistor 48 to pull down the base voltage of the clamping transistor 54 so that no current flows from the emitter of transistor 54. Transistor 38 is conductive to provide unaddressed all standby word line current through the word line 36 with amplitude established by the current source including transistor 40 and resistor 42. Because transistor 54 is non-conductive, transistor 38 draws all its currents through the word line 36.

The positive output signal from the buffer 49 is also applied to the base of transistor 96 so that it conducts current through its current source including transistor 98 and resistor 100. Since transistor 96 is conductive, no emitter current will flow through its companion transistor 94 so that the base of the switching transistor 90 will go to a high state to render that transistor conductive to provide current to the bit line clamp circuit to permit normal operation of that circuit to clamp the bit lines in their normally operating high state. Transistors 60 and 62 between $V_{cc}$ conductor 58 and the bit lines 24 and 26, respectively, are normally off during operation of the memory. Transistors 64 and 66 in series between ground reference and bit lines 24 and 26, respectively, remain non-conducting during reading operations and may be selectively enabled during writing operations to appropriately steer the bit line currents.

PRESETTING OPERATION

To preset the entire memory to a desired state, a reset signal is applied to the reset input buffer 49 which produces a low output to the bases of transistors 38, 48 and 96, to thereby render them non-conductive while the transistors 46, 50 and 94 are rendered conductive. When thus cut off, transistor 38 ceases to pass the standby current from the bottom word line 38. Transistor 48, being cut off, permits the base of transistor 54 to go to its high state. Transistor 54, now conductive, applies a high $V_{cc}$ voltage level to the bottom word line 36 to cut off all standby current. Transistors 46 and 50 are now conducting so that the current established by the source transistors 40 and 44 now pull current from the bit lines 24 and 26.

The low level control signal applied to transistor 96 turns off that transistor while rendering transistor 94 conductive to pull down the voltage on the base of transistor 90 and thus render that transistor non-conductive. Power is therefore removed from the bit line clamp comprising transistors 76, 78, 80 and 82 so that the clamp can no longer source current into the bit lines 24 and 26. The diode 102 connected between the bases of transistors 76 and 78 and the emitter of transistor 90 speeds the rate of fall of current from the bases of the transistors 76 and 78. At this point the states of the read/write control transistors 60 and 62 will determine which side of the memory cells will source the bit line current. If the read/write control transistor 60 is enabled and transistor 62 is disabled, the transistor 60 and the cell transistor 30 will source bit line current. Conversely, if transistor 60 is disabled and transistor 62 is enabled, the transistors 62 in the cell transistor 28 will source the bit line current. When the desired read/write control transistor 60 or 62 is enabled, the input signal to the reset input buffer 49 is reversed to produce a high output signal to the bases of transistors 38, 48 and 96 to restore cell standby current to the emitters of the cell transistors 32 and 34 and all other transistors associated with the bottom word line 36, and also to restore the power to the bit line clamps associated with each pair of vertical bit lines in the memory. The particular cell transistors, e.g., 28 or 30, that are sourcing current into their respective bit line will be set and upon reopening of the closed read/write control transistor 60 or 62, all memory cells will be reset to the same desired binary number.

I claim:

1. Circuitry for presetting a bipolar random access memory, said memory including a plurality of memory cells in a matrix of columns and rows, each of said plurality of cells including a bistable flip-flop with each of the inverters of said flip-flop having first and second emitters, the first emitters of all memory cells in each row of said matrix being coupled together and to a bottom word line terminating in a first grounded current source, the second emitters of all memory cells in each column being coupled to one of a plurality of bit line pairs, each bit line inset pairs being terminated in a second grounded current source, each of said bit line pairs being coupled to a bit line clamping circuit, said memory presetting circuitry comprising:

reset signal input circuitry for producing a high output signal during operation of said memory and a low output signal for presetting said memory;

first circuit means interposed between each bottom word line and its respective first grounded current source, and responsive to said low output signal for breaking the circuit between said word line and its current source and for applying $V_{cc}$ to each of said word lines;

second circuit means coupled between each bit line clamping circuit and its respective power source, said second circuit means responsive to said low output signal for disabling said clamping circuit;

third circuit means coupled to each bit line in each pair of said plurality of bit line pairs, said third circuit means responsive to said low output signal for drawing current from said bit line; and read/write control means interposed between each bit line and a positive voltage source for selectively applying said positive voltage to one bit line in each of said pairs.

2. The memory presetting circuitry claimed in claim 1 wherein said first circuit means includes first and second NPN transistors, the emitter of said first transistor being coupled to said bottom word line and to the collector of said second transistor, the emitter of said second transistor being coupled to the first current source and the collector of said first transistor being coupled to a positive voltage source, said second transistor being rendered non-conductive and said first transistor being rendered conductive by a low output signal from said reset signal input circuitry.

3. The memory presetting circuitry claimed in claim 2 wherein said first circuit means includes a third NPN transistor coupled between the base of said first transistor and a second current source, said third transistor being rendered non-conductive by said low output signal from said reset signal input circuitry to thereby enable said first transistor.

4. The memory presetting circuitry claimed in claim 3 wherein said third circuit means includes fifth and sixth NPN transistors, the collectors of each of said fifth and sixth transistors being coupled to one bit line in a bit line pair, the emitters of each of said fifth and sixth transistors coupled to a current source, said fifth and sixth transistors being simultaneously enabled by said low output signal.

5. The memory presetting circuitry claimed in claim 4 wherein said fifth transistor and said second transistor are connected as a differential circuit, the emitters of said fifth and second transistors being coupled together and to said first current source; and wherein said sixth and said third transistors are connected as a differential circuit, the emitters of said sixth and third transistors being coupled together and to said second current source.

6. The memory presetting circuitry claimed in claim 1 wherein said second circuit means includes a fourth NPN transistor coupled between said bit line clamping circuitry and its power source, said fourth transistor being disabled by a low output signal from said reset signal input circuitry.

* * * * *